United States Patent [19]

Daniel

[11] 4,398,619

[45] Aug. 16, 1983

[54] LOUDSPEAKER CABINET

[76] Inventor: Ronald L. S. Daniel, Whistlers Wood Farm, Southview Rd., Woldingham, Surrey, England

[21] Appl. No.: 363,662

[22] Filed: Mar. 31, 1982

[30] Foreign Application Priority Data

Apr. 2, 1981 [GB] United Kingdom ................. 8110400

[51] Int. Cl.[3] ................................................ H05K 5/00

[52] U.S. Cl. ....................................... 181/156; 181/145; 181/199

[58] Field of Search ............... 181/145, 152, 155, 156, 181/199

[56] References Cited

U.S. PATENT DOCUMENTS 2,277,525 3/1942 Mercuoius ......................... 181/156

3,142,353 7/1964 Todisco .............................. 181/145

*Primary Examiner*—Benjamin R. Fuller

*Attorney, Agent, or Firm*—Fleit, Jacobson & Cohn

[57] ABSTRACT

A loudspeaker cabinet comprising front, back, top, bottom and side panels, a speaker drive unit positioned on an upper portion of the front panel, first and second spaced apart sound wave reflector panels positioned below the speaker unit and extending from the front panel towards the rear panel but not engaging the rear panel, a first sound wave pressure relief area defined by the rear panel and the end of the first reflector panel adjacent the rear panel, a second sound wave pressure relief area defined by the rear panel and the end of the second reflector panel adjacent the rear panel, and a third sound wave pressure relief area constituted by a relief aperture which is positioned below the second reflector panel and in the front panel, the loudspeaker cabinet being such that the first and the second reflector panels divide the interior of the loudspeaker cabinet into first, second and third compartments with the speaker drive unit being positioned in the first compartment whereby sound waves from the speaker drive unit are reflected between the first reflector panel and the top panel before passing through the first relief area, and whereby the sound waves are then reflected between the first and the second reflector panels before passing through the second relief area, and whereby the sound waves are then reflected between the second reflector panel and the bottom panel before passing through the third relief area.

8 Claims, 4 Drawing Figures

LOUDSPEAKER CABINET

This invention relates to a loudspeaker cabinet.

Loudspeaker cabinets are well known. In order to obtain the required tonal quality of sound from the known loudspeaker cabinets, they are usually provided internally with a labyrinth or folded horn system for extending the sound wave length inside the cabinet.

It is an aim of the present invention to provide a loudspeaker cabinet which is of a simpler construction than the known loudspeaker cabinets employing labyrinth or folded horn systems, but which is able to give a comparable tonal quality of sound.

Accordingly, this invention provides a loudspeaker cabinet comprising front, back, top, bottom and side panels, a speaker drive unit positioned on an upper portion of the front panel, first and second spaced apart sound wave reflector panels positioned below the speaker unit and on the front panel so as to extend from the front panel towards the rear panel but not to engage the rear panel, a first sound wave pressure relief area defined by the rear panel and the end of the first reflector panel adjacent the rear panel, a second sound wave pressure relief area defined by the rear panel and the end of the second reflector panel adjacent the rear panel, and a third sound wave pressure relief area constituted by a relief aperture which is positioned below the second reflector panel and in the front panel, the loudspeaker cabinet being such that the first and the second reflector panels divide the interior of the loudspeaker cabinet into first, second and third compartments with the speaker drive unit being positioned in the first compartment whereby sound waves from the speaker drive unit are reflected between the first reflector panel and the top panel before passing through the first relief area, and whereby the sound waves are then reflected between the first and the second reflector panels before passing through the second relief area, and whereby the sound waves are then reflected between the second reflector panel and the bottom panel before passing through the third relief area.

The sound waves may travel between the opposing surfaces of the first reflector panel and the top panel, the first and the second reflector panels, and the second reflector panel and the bottom panel one or more times before passing through the appropriate relief area. As the sound waves are passing through the first and the second relief areas, they will also reflect off the inner surface of the front, rear and side panels.

The speaker drive unit may be positioned in the upper half of the first compartment. However, if desired, the speaker drive unit may be positioned on the centre line of the first compartment, or it can be positioned in the lower half of the first compartment.

The third relief area may be positioned in the upper half of the third compartment. If desired, the third relief area may be positioned on the centre line of the third compartment, or it may be positioned in the lower half of the third compartment.

In one embodiment of the invention, the first compartment is larger than the second compartment, and the second compartment is larger than the third compartment.

Usually, the third relief area will extend substantially the entire width of the front panel. Preferably, the third relief area is rectangular in shape although it will be appreciated that other shapes may be employed.

The first and the second reflector panels may extend the entire width of the front panel so that the edges of the first and the second reflector panels engage the side panels.

Advantageously, the first and the second reflector panels extend for substantially three quarters of the width of the side panels. It is to be appreciated that the first and the second reflector panels may extend for more or less than substantially three quarters of the width of the side panels.

The loudspeaker cabinet may be made from materials presently employed for making known loudspeaker cabinets. Thus, for example, the front, back, top, bottom and side panels may be made of high density chipboard or plyboard. The panels may be braced with battons and an adhesive may be provided at joining corners in addition to or instead of the battons. The first and the second reflector panels may be made of plywood. Generally, the loudspeaker cabinet will be finished to look aesthetically pleasing and it may be provided with a wood veneer, a simulated veneer or a laminate. The front panel will usually be covered externally in acoustic foam or acoustic cloth.

An embodiment of the invention will now be described solely by way of example and with reference to the accompanying drawings in which.

Figure 1:
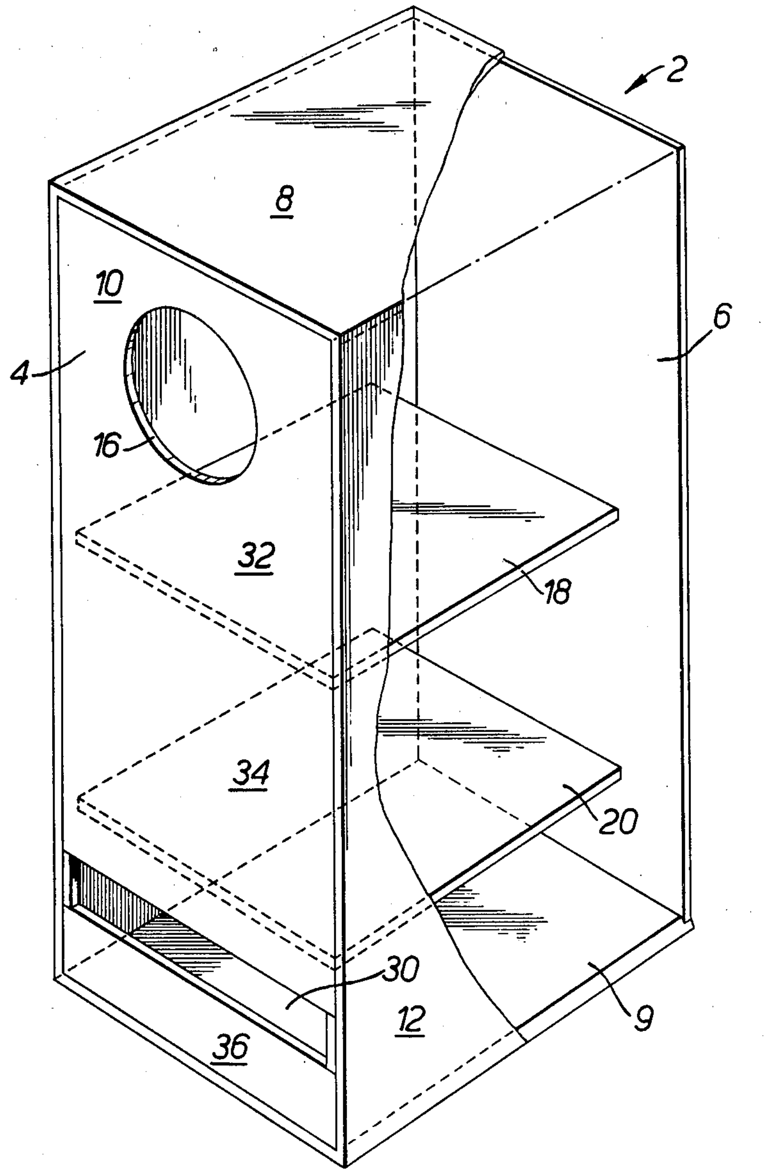
FIG. 1 is a perspective view partially broken away of a loudspeaker cabinet.

Referring to the drawings, there is shown a loudspeaker cabinet 2 comprising a front panel 4, a back panel 6, a top panel 8, a bottom panel 9 and side panels 10, 12. The loudspeaker cabinet 2 further comprises a single speaker drive unit 14 which is positioned as illustrated on an upper portion of the front panel. The front panel 4 is provided with a circular hole 16 for receiving the drive unit 14.

The loudspeaker cabinet 2 has first and second spaced apart sound wave reflector panels 18, 20 positioned below the speaker unit 14 and on the front panel 4 so as to extend from the front panel 4 towards the rear panel 6 but not to engage the rear panel 6. A first sound wave pressure relief area 22 is defined by the rear panel 6 and the end 24 of the first reflector panel 18 adjacent the rear panel 6. A second sound wave pressure relief area 26 is defined by the rear panel 6 and the end 28 of the second reflector panel 20 adjacent the rear panel 6.

Figure 2:
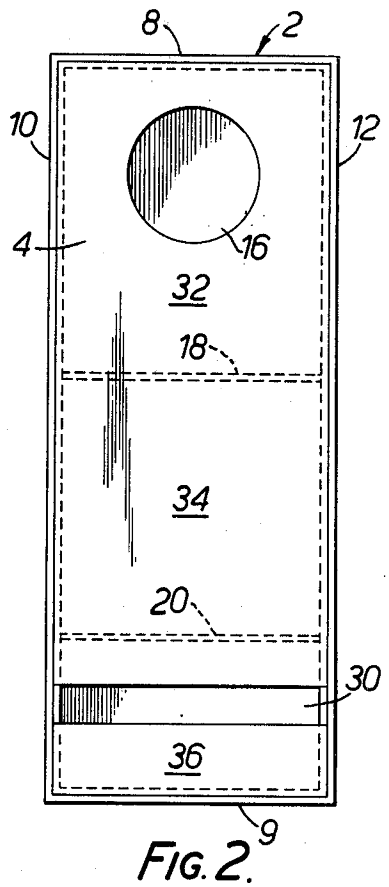
FIG. 2 is a front view of the loudspeaker cabinet shown in FIG. 1.
Figure 3:
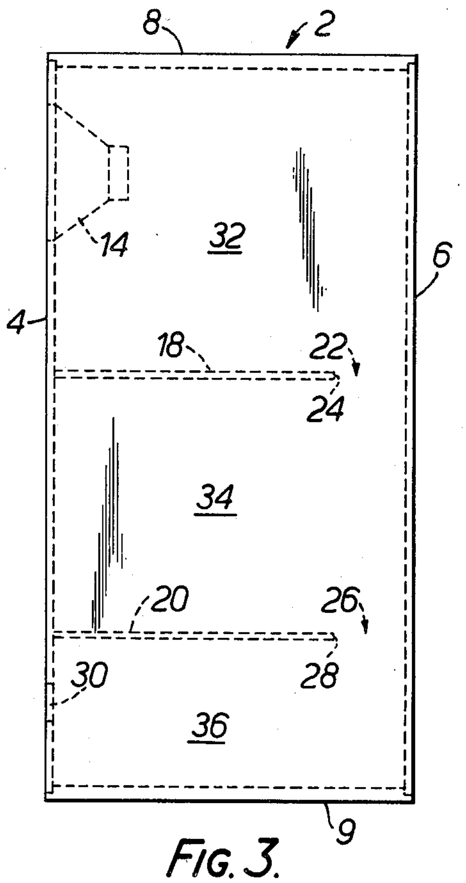
FIG. 3 is a side view of the loudspeaker cabinet shown in FIG. 1.
Figure 4:
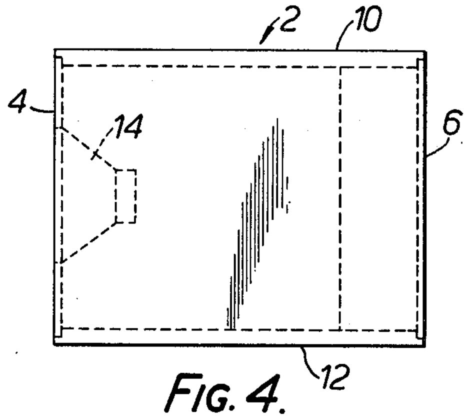
FIG. 4 is a top plan view of the loudspeaker cabinet as shown in FIG. 1.

The loudspeaker cabinet 2 is provided with a third sound wave pressure relief area constituted by a relief aperture 30. The relief aperture 30 is positioned below the second reflector panel 20 and in the front panel 4. As can be seen from FIGS. 1 and 2, the relief aperture 30 extends substantially the entire width of the front panel 4.

The loudspeaker cabinet 2 is such that the first and second reflector panels 18, 20 divide the interior of the loudspeaker cabinet 2 into a first compartment 32, a second compartment 34 and a third compartment 36. As can be seen from the drawings, the speaker drive unit 14 is positioned in the first compartment 32 and the relief aperture 30 is positioned in the third compartment 36.

The speaker drive unit 14 may be a standard known speaker drive unit and it may operate in a known manner to receive electrical signals and convert them into audio signals. When the audio signals are generated, sound waves from the speaker drive unit 14 are reflected between the first reflector panel 18 and the inside surface of the top panel 8. The sound waves then pass through the first relief area 22 and they get reflected off the inside surface of the rear panel 6 into the second compartment 34. The sound waves in the second compartment 34 are reflected between the first and the second reflector panels 18, 20 before passing through the second relief area 26. The sound waves passing through the second relief area 26 are reflected from the inside surface of the rear walls 6 into the third compartment 36 where they are reflected between the second reflector panel 20 and the inside surface of the bottom panel 9. The sound waves then pass through the relief aperture 30. The sound waves can be reflected once or many times between the various opposing surfaces constituted by the first reflector panel 18 and the top panel 8, the first and second reflector panels 18, 20, and the second reflector panel 20 and the bottom panel 9.

It will be apparent from the drawings that the loudspeaker cabinet 2 is easy to construct and it can therefore be manufactured relatively cheaply. However, by the strategic placement of the sound wave reflector panels 18, 20, good quality sound can be obtained from the loudspeaker cabinet 2. The loudspeaker cabinet 2 operates on the principle that, given that the angle of incidence of a sound wave is influenced by the pressure opposing it, then the loudspeaker cabinet size and the size of the relief areas 22, 26, 30 can be calculated to produce a desired extended sound wave length within the loudspeaker cabinet 2 without recourse to the hitherto required labyrinth or folded horn systems. The loudspeaker cabinet 2 enables the control of the angle of incidence of the sound waves within the compartments 32, 34, 36 by regulation of pressure, and this pressure regulation is in turn effected by means of the pressure relief areas 22, 26, 30.

The front panel 4, the back panel 6, the top panel 8, the bottom panel 9 and the side panels 10, 12 may be made from high density chipboard or plyboard. They may be braced with battons and/or adhesives at corners. The reflector panels 18, 20 may be made from plyboard. The loudspeaker cabinet 2 may be decoratively finished with a wood veneer, a simulated veneer or a laminate material. The outside of the front panel 4 will usually be provided with acoustic foam or acoustic cloth. The inside of the cabinet may be provided with known sound enhancing materials such for example as a bitumastic compound may take the form of a vehicle undersealing compound. Baff wadding may also be used to assist in tuning to taste. The reflector panels 18, 20 can be held in position by any desired means such for example as rebating the side panels 10, 12 and fixing the reflector panels 18, 20 in position with adhesives and pins. Alternatively, battons may be employed such for example as along the side panels 10, 12 and/or along the front panel 4, and the reflector panels 18, 20 may be fixed to the batons with adhesives and/or screws.

As indicated above, the loudspeaker cabinet 2 has only one speaker drive unit 14. This speaker drive unit 14 may be a single or a double diaphragm full range speaker drive unit. The speaker cabinet 2 will be varied in shape so that it will be specifically designed to suit the specific type of speaker drive unit employed to reproduce the desired sound wavelength. The diameter of the piston employed in the speaker drive unit is important because low frequency sound waves emanate from the rim of the piston. The speaker drive unit 14 may thus require to be positioned marginally above or below a centre line in the compartment 32 and at an angle to the front panel 4 in order to direct the sound waves onto the first reflector panel 18 so that the first reflector panel 18 can reflect the sound waves up to the top panel 8 and then onto the rear panel 6 and through the relief aperture 22 as described above. The sound wave reflection is repeated as described above until the sound waves pass through the relief aperture 30. The distance between the reflector panels 18, 20, the size of the relief areas 22, 26, 30, and the size of the entire loudspeaker cabinet 2, will depend upon the size of the drive unit 14 used and the sound wave length required.

It is to be appreciated that the embodiment of the invention described above with reference to the accompanying drawings has been given by way of example only and that modifications may be effected. Thus, for example, the first and the second relief areas 22, 26 may be of different sizes, and the relief aperture 30 may be provided with a grill.

I claim:

1. A loudspeaker cabinet comprising front, back, top, bottom and side panels, a speaker drive unit positioned on an upper portion of the front panel, first and second spaced apart sound wave reflector panels positioned below the speaker unit and extending from the front panel towards the rear panel but not engaging the rear panel, a first sound wave pressure relief area defined by the rear panel and the end of the first reflector panel adjacent the rear panel, a second sound wave pressure relief area defined by the rear panel and the end of the second reflector panel adjacent the rear panel, and a third sound wave pressure relief area constituted by a relief aperture which is positioned below the second reflector panel and in the front panel, the loudspeaker cabinet being such that the first and the second reflector panels divide the interior of the loudspeaker cabinet into first, second and third compartments with the speaker drive unit being positioned in the first compartment whereby sound waves from the speaker drive unit are reflected between the first reflector panel and the top panel before passing through the first relief area, and whereby the sound waves are then reflected between the first and the second reflector panels before passing through the second relief area, and whereby the sound waves are then reflected between the second reflector panel and the bottom panel before passing through the third relief area.

2. A loudspeaker cabinet according to claim 1 in which the speaker drive unit is positioned in the upper half of the first compartment.

3. A loudspeaker cabinet according to claim 1 in which the third relief area is positioned in the upper half of the third compartment.

4. A loudspeaker cabinet according to claim 1, claim 2 or claim 3 in which the first compartment is larger than the second compartment, and the second compartment is larger than the third compartment.

5. A loudspeaker cabinet according to claim 1, claim 2 or claim 3 in which the third relief area extends substantially the entire width of the front panel.

6. A loudspeaker cabinet according to claim 1, claim 2 or claim 3 in which the third relief area is rectangular in shape.

7. A loudspeaker cabinet according to claim 1, claim 2 or claim 3 in which the edges of the first and the second reflector panels engage the side panels.

8. A loudspeaker cabinet according to claim 1, claim 2 or claim 3 in which the edges of the first and the second reflector panels engage the side panels, and in which the first and the second reflector panels extend for substantially three quarters of the width of the side panels.

* * * * *